United States Patent [19]

Tamano et al.

[11] Patent Number: 4,672,735
[45] Date of Patent: Jun. 16, 1987

[54] CONNECTOR PIN INSERTER

[75] Inventors: Michio Tamano, Oyama; Yoshiaki Kawasaki, Hasuda, both of Japan

[73] Assignee: Fujitsu Limited, Kanagawa, Japan

[21] Appl. No.: 813,945

[22] Filed: Dec. 27, 1985

[30] Foreign Application Priority Data

Dec. 28, 1984 [JP] Japan .................. 59-274530

[51] Int. Cl.⁴ .................. B23P 19/00; H05K 3/00
[52] U.S. Cl. .................. 29/564.6; 29/566.2; 29/718; 29/739; 29/845
[58] Field of Search .................. 29/739, 718, 715, 741, 29/564.6, 566.2, 709, 845, 842, 33 K, 33 M

[56] References Cited

U.S. PATENT DOCUMENTS

| | | | |
|---|---|---|---|
| 3,566,464 | 3/1971 | Bakermans | 29/566.2 |
| 3,722,062 | 3/1973 | Gitaraibeh | 29/739 X |
| 3,765,075 | 10/1973 | Olney, Jr. | 29/718 X |
| 3,939,542 | 2/1976 | Reggi | 29/718 |
| 4,058,881 | 11/1977 | Gavin et al. | 29/739 X |
| 4,166,316 | 9/1979 | Misawa | 29/739 X |
| 4,265,013 | 5/1981 | Brown | 29/845 X |
| 4,365,398 | 12/1982 | Chisholm | 29/564.6 |
| 4,372,044 | 2/1983 | Chisholm | 29/845 |
| 4,464,833 | 8/1984 | Duncan | 29/739 X |
| 4,506,438 | 3/1985 | Ammon et al. | 29/739 |
| 4,551,901 | 11/1985 | Bonifanti et al. | 29/564.6 |

FOREIGN PATENT DOCUMENTS

| | | | |
|---|---|---|---|
| 65299 | 11/1982 | European Pat. Off. | 29/741 |
| 2266429 | 10/1975 | France | 29/741 |
| 88280 | 8/1978 | Japan | 29/564.6 |
| 452643 | 5/1968 | Switzerland | 29/741 |
| 2020583 | 11/1979 | United Kingdom | 29/741 |

Primary Examiner—William R. Briggs
Attorney, Agent, or Firm—Staas & Halsey

[57] ABSTRACT

A connector pin inserter feeds and separates continuous, integrally formed connector pins from a belt-like carrier, and presses and thereby inserts the separated connector pins into through holes of a printed circuit board. The type of printed circuit board is detected and press-inserting conditions are determined for controlling the pin inserting operation, based on data relating to the board thickness, press-inserting position, pin size, and insertion pitch, corresponding to the detected type of printed circuit board, and provided to a press-inserting mechanism. Moving conditions are supplied to an X-Y positioning table which sets the position of the printed circuit board relative to the press-inserting mechanism for pressing the connector pins into the appropriate through holes of the printed circuit board in a sequence of program-controlled operations. A cam link mechanism drives the mechanical elements for separating a predetermined number of connector pins from the carrier, for pressing the appropriate connector pins into corresponding holes of the printed circuit board, and for intermittently feeding the carrier in accordance with the sequentially controlled operations.

20 Claims, 24 Drawing Figures

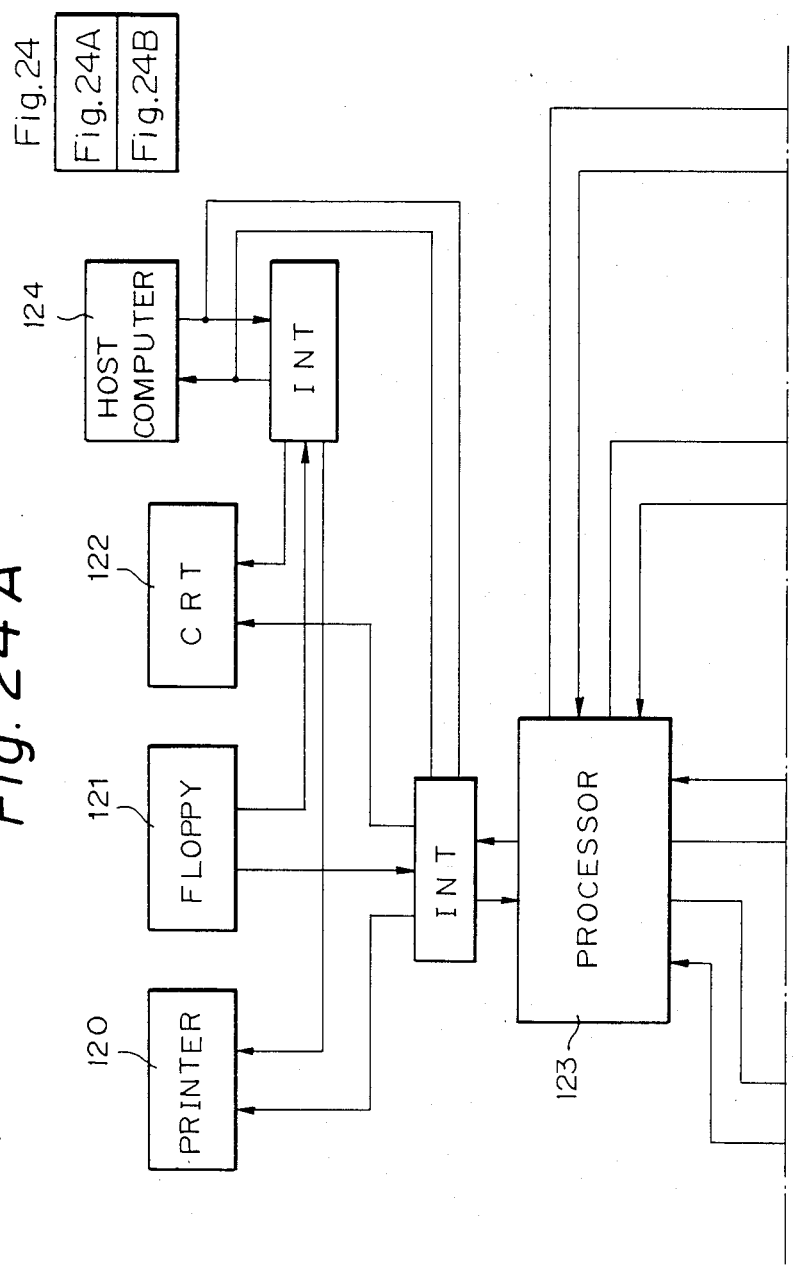

CONNECTOR PIN INSERTER

BACKGROUND OF THE INVENTION (1) Field of the Invention

The present invention relates to a connector pin inserter for the fabrication of printed circuit boards having connector pins, such as back panels of housing apparatuses for containing printed circuit boards in electronic appliances and communication appliances.

(2) Description of the Related Art

In the conventional connector pin inserter, a plurality of connector pins are arranged in parallel and held on a clamper, the clamper is brought down toward a printed circuit board set at a predetermined position below the clamper, the connector pins are pressed into through holes of the printed circuit board, and the clamper is opened and lifted up.

In the conventional connector pin inserter, however, since connector pins are separately formed in advance, it is impossible to automatically attach a plurality of connector pins to the clamper and an operator must attach these pins manually one by one to the clamper. Accordingly, the step of pressing connector pins into through holes of a printed circuit board requires time and labor, and therefore, automation of the production line for printed circuit boards is inhibited.

SUMMARY OF THE INVENTION

It is therefore a primary object of the present invention to provide a connector pin inserter in which automation of the step of pressing connector pins into through holes of a printed circuit board is made possible by feeding a connector pin material to the inserter, automatically holding the connector pin material by a clamper, and pressing connector pins into through holes.

Another object of the present invention is to provide a connector pin inserter in which, at the above-mentioned automated step of pressing pins into through holes, a series of operations of cutting, pressing-inserting, and feeding the pin material are synchronized, pins can be press-inserted under a high pressure, and a product having a high reliability can be obtained.

Still another object of the present invention is to provide a connector pin inserter in which at the above-mentioned automated step, deformation of a connector pin or erroneous clamping can be easily detected.

In accordance with the present invention, these objects are attained by a connector pin inserter for feeding continuous connector pins formed integrally in a comb-like form as a belt-like carrier, separating the connector pins from the carrier, and pressing the connector pins into through holes of a printed circuit board. The connector pin inserter comprises a board detector for detecting the kind of printed circuit board, means for reading detection results from the board detector, applying moving conditions to an X-Y table, disposed below a press-inserting mechanism for the connector pin, to set the position of the printed circuit board, and further applying press-inserting conditions to a press-inserting mechanism for performing a series of press-inserting operations for the pins, based on data giving the board thickness, press-inserting position, pin size, and insention pitch selected according to the kind of printed circuit board detected, and a plurality of cam link mechanisms arranged on a same cam axis. The connector pin inserter further comprises the following means driven by each cam link mechanism: (a) cutting means for separating a predetermined number of connector pins held by a clamping mechanism, (b) push-out means for pushing out the clamping mechanism holding the separated connector pins thereon from an inserter head and pressing the connector pins into through holes of the printed circuit board, (c) rotating means for rotating the inserter head around an axis parallel to the feed direction of the carrier, and (d) feed means for intermittently feeding the carrier, wherein the series of operations for cutting and separating the continuous connector pins and inserting the separated connector pins into through holes of the printed circuit board are sequentially controlled.

DESCRIPTION OF THE PREFERRED EMBODIMENTS

Figure 1:
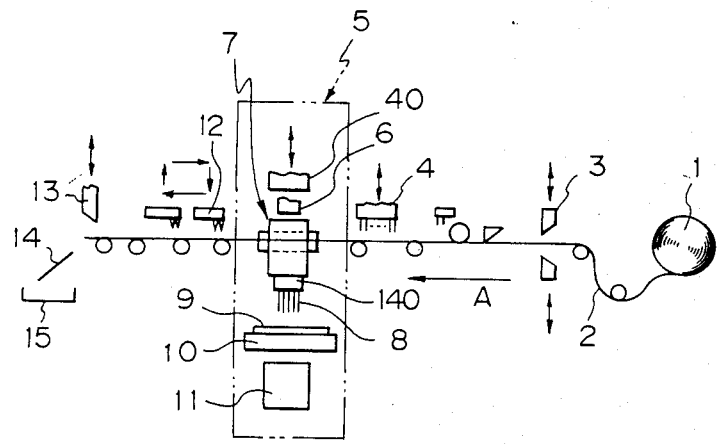
FIG. 1 is a schematic diagram illustrating the structure of a connector pin inserter according to the present invention.
Figure 2:
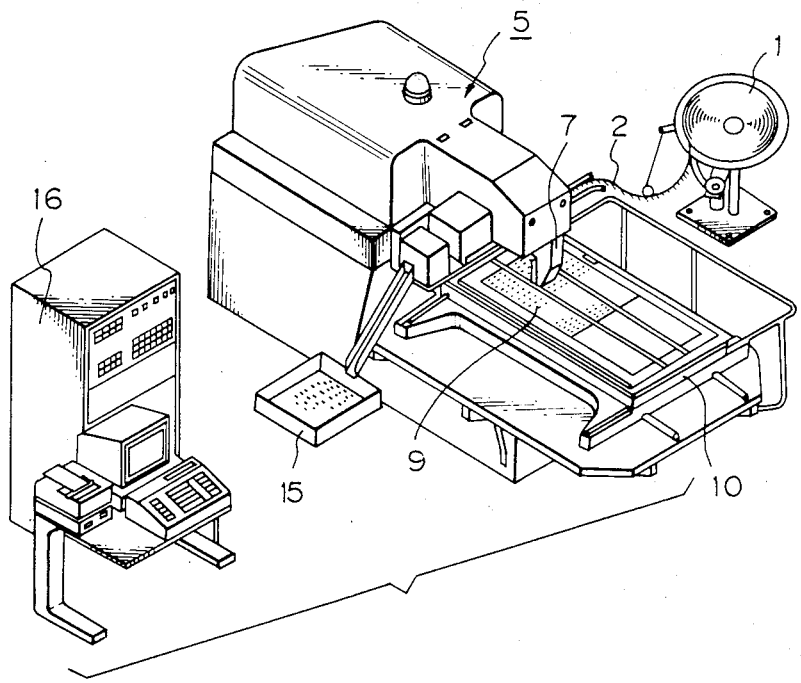
FIG. 2 is a perspective view showing the appearance of the inserter shown in FIG. 1.

FIG. 1 is a diagram illustrating the structure of a connector pin inserter according to the present invention and FIG. 2 is a perspective view showing the appearance thereof. A continuous belt (carrier) 2 is fed from a feed roll 1 in a direction indicated by an arrow A. This continuous belt 2 comprises connector pins integrally connected in a continuous comb-like form, as described in detail hereinafter. Where the pitch of connector pins in the continuous belt is narrower than the intervals of through holes of a printed circuit board 9, the pitch is expanded by a pitch expanding means 3 in a manner described hereinafter. When the presence or absence of pins in the belt 2 is checked by a connector pin detector 4 and the normal state is confirmed, the respective pins are pressed into through holes of the printed circuit board 9 in a press-inserting zone 5. The printed circuit board 9 is placed on an X-Y table 10, and a support means 11 is disposed below the X-Y table 10 to support the press-inserting position of the printed circuit board from below at the pin-inserting step. Connector pins 8 are clamped while in the horizontal belt 2 by a clamper 140 of an inserter head 7, and the pins 8 are cut and separated from a belt frame by a cutting means 6. Subsequently, the inserter head 7 is rotated by 90° to direct the connector pins 8 downward, and the clamper 140 is pushed out and downward by pressing means 40 to press the connector pins 8 into through holes of the printed circuit board 9. The belt 2 is intermittently fed by feed means 12 synchronously with the operation of cutting and separating the connector pins 8, the operation of pushing out the clamper 140, and the operation of rotating the inserter head 7. The belt 2 from which the connector pins 8 have been cut is cut into an appropriate length and is contained in a scrap box 15 as pieces of scrap 14. This operating series is controlled by a program in a control unit 16 including a microcomputer or the like.

Figure 3:
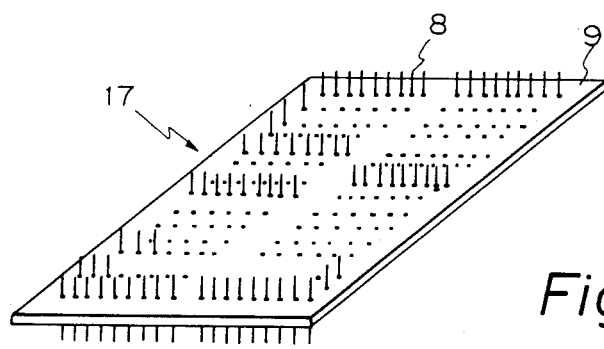
FIG. 3 is a perspective view showing the appearance of a back panel.
Figure 4:
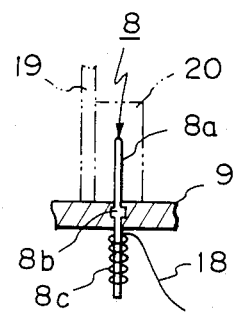
FIG. 4 is a view illustrating in detail a part of the back panel.

FIG. 3 is a perspective view showing the appearance of a back panel 17 to which the present invention is applied. Many connector pins are inserted and secured in through holes (not shown) of the printed circuit board 9 having a printed circuit (not shown) formed thereon. As shown in FIG. 4, a connector 20 of another printed circuit board 19 is coupled to the connector pins 8 of this back panel 17. Each connector pin 8 comprises a connecting portion 8a to be coupled to the connector 20, a central enlarged portion 8b, and a terminal portion 8c projecting from the back face of the printed circuit board 9. Gold is plated on the connecting portion 8a. The enlarged portion 8b, formed by flattening, tightly secures the pin to the printed circuit board when the connector pin 8 is pressed into the printed circuit board 9. A wrapping wire 18 is connected to the terminal portion 8c.

Figure 5:
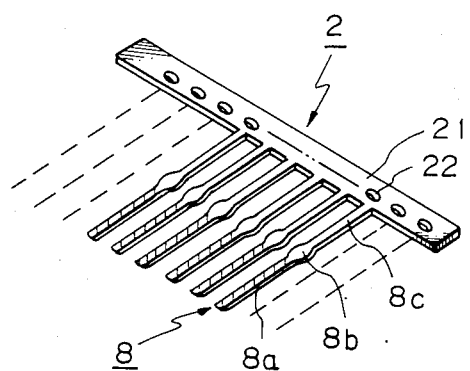
FIG. 5 a perspective view showing a continuous belt of connector pins according to the present invention.

These connector pins 8 are formed by press-cutting a belt-like metal sheet and are connected in parallel in a comb-like form by a continuous frame 21 as shown in FIG. 5. Feed holes 22 are formed at constant intervals on the frame 21. The connecting portions 8a of the respective connector pins 8 are plated with gold while in this continuous belt 2. Accordingly, the plating operation can be performed more smoothly than when the respective pins are separately plated.

Figure 6:
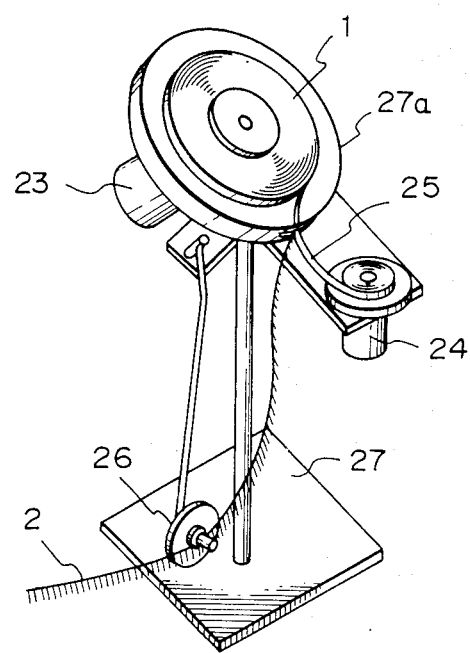
FIG. 6 is a perspective view showing a zone for feeding the belt of connector pins.

FIG. 6 is a diagram illustrating in detail the zone for feeding the continuous belt 2. The belt 2 is wound together with an interlayer sheet 25, for preventing entanglement of the connector pins, into the form of a feed roll 1 and the feed roll 1 is contained in a tray 27a on a stand 27. Reference numeral 23 represents a belt-feeding motor and reference numeral 24 represents a motor for winding the interlayer sheet 25. The belt 2 is fed through a slack detector 26 for detecting the tension on the belt 2 and the feed motor 23 is controlled based on the result of the detection of the tension so that an appropriate amount of the belt is always supplied.

Figure 7:
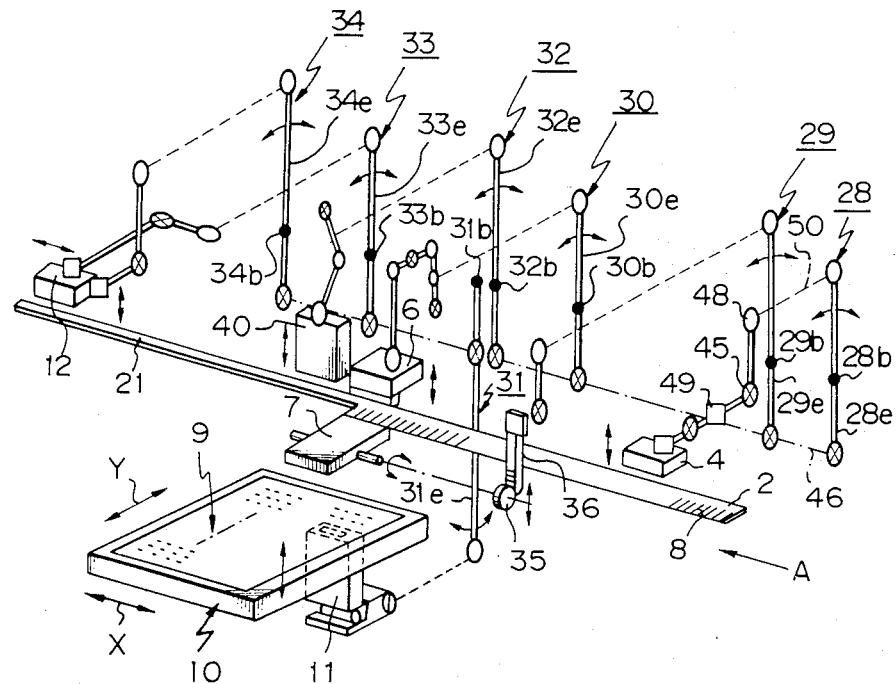
FIG. 7 is a diagram illustrating the structure of cam means for press-inserting the connector pins.
Figure 8:
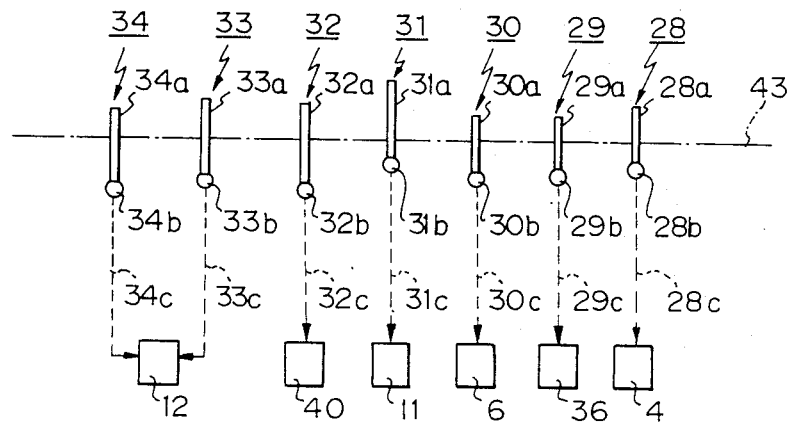
FIG. 8 is a diagram illustrating the arrangement of the cam means shown in FIG. 7.

FIG. 7 is a diagram illustrating the structure of a driving mechanism of a press-inserting zone 5. First to seventh cam link mechanisms 28 through 34 are arranged in sequence along the feed direction of the belt 2. As shown in FIG. 8, in the cam link mechanisms 28 through 34, cam movements are performed by cam discs 28a through 34a attached to a common cam shaft 43 and cam followers 28b through 34b driven by the cam discs, and corresponding objects are driven by these cam link mechanisms through link means 28c through 34c. The cam followers 28b through 34b are mounted on swinging levers 28e through 34e pivoted on a common shaft 46, respectively. In each of the cam link mechanisms 28 through 34, for example, as in the link mechanism 28 shown in FIG. 7, the cam movement is converted into a desired linear movement and transmitted by the combination of a stationary rotation shaft 45 indicated by mark ⊗, a movable rotation shaft 48 indicated by mark ○, a sliding piece 49 indicated by mark □, and a connecting rod 50. The first cam link mechanism 28 vertically moves a pin detector 4 for detecting the presence or absence of pins in the belt 2. The second cam link mechanism 29 vertically moves a rack 36 of a rack pinion means for rotating the inserter head 7. The third cam link mechanism 30 vertically moves a cutting means 6 for cutting and separating connector pins 8 in the belt 2. The fourth cam link mechanism 31 vertically moves a support means 11 arranged below the printed circuit board 9 on the X-Y table 10 having a shape of a rectangular frame. The fifth cam link mechanism 32 vertically moves a means 40 for press-inserting pins. The sixth cam link mechanism 33 vertically moves a feed means 12, and the seventh cam link mechanism 34 horizontally moves a feed means 12.

Figure 9:
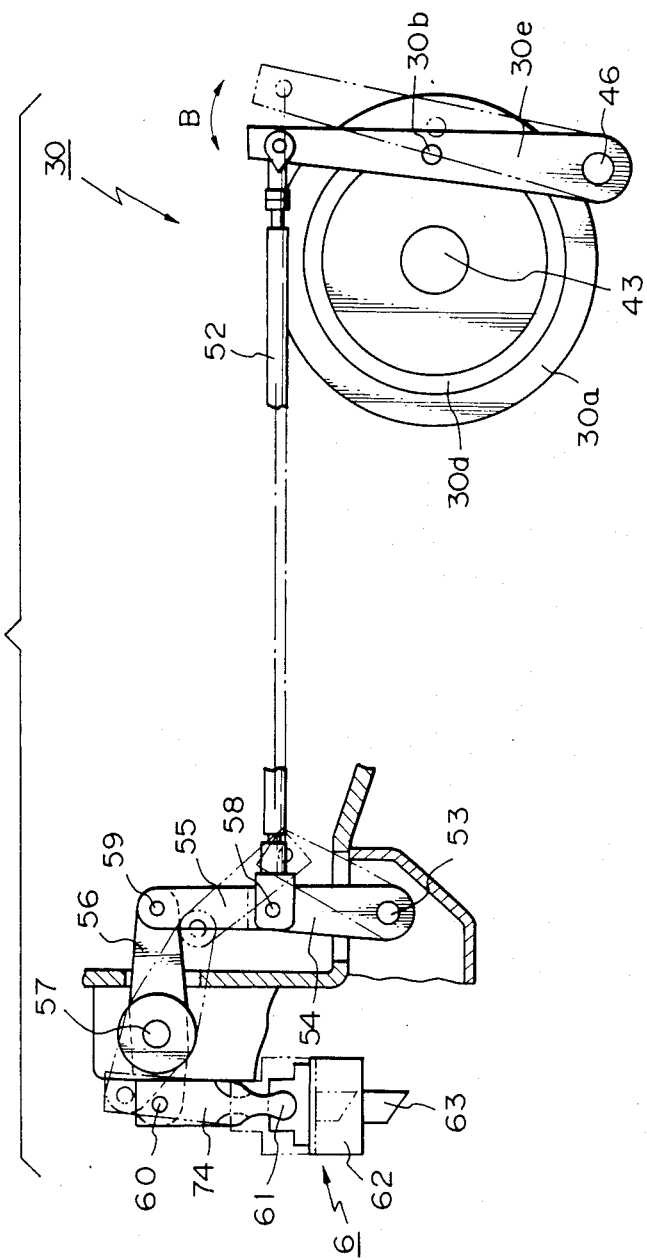
FIG. 9 is a diagram illustrating the structure of a cam mechanism forming a part of the cam means shown in FIG. 7.

As an example of the cam link mechanism, the structure of the third cam link mechanism 30 is shown in FIG. 9. A cam disc 30a is attached to the common cam shaft 43. A cam groove 30d is formed on the cam disc 30a. A cam follower (projection) 30b is formed on a swinging lever 30e attached to the common shaft 46, and this projection 30b is engaged with the groove 30d and is oscillated as indicated by an arrow B by rotation of the cam disc 30a. This oscillating movement is transmitted to a lever assembly of the cutting means 6 through a rod 52. The lever assembly comprises a first lever 54 pivoted on a stationary shaft 53, a second lever 55 connected to the first lever 54 through a shaft 58, a third lever 56 connected to the second lever 55 through a shaft 59, and a shank 74 connected to the end of the third lever 56 through a shaft 60. The rod 52 and the first and second levers 54 and 55 form a toggle mechanism and the third lever 56 forms a bell crank mechanism. The lower end 61 of the shank 74 is rotatably connected to a supporting block of a cutter 63. The rod 52 is connected to the shaft 58. By the oscillating movement of the swinging lever 30e, the lever assembly is moved between the solid line and the dash-dot line to move the cutter 63 vertically through the toggle mechanism and bell crank mechanism.

Figure 10:
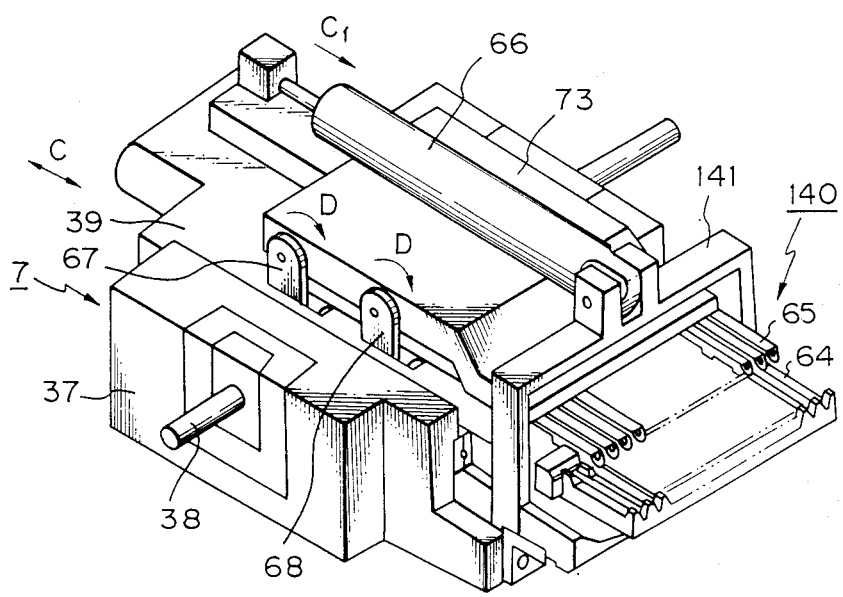
FIG. 10 is a perspective view illustrating an inserter head according to the present invention.

FIG. 10 is a perspective view of the inserter head 7. A head holder 37 is secured to a shaft 38. A slider 39 slidable as indicated by an arrow C relative to the head holder 37 is arranged within the head holder 37. A clamper 140 is arranged on the end portion (front end) of the slider 39. The clamper 140 comprises a lower plate 64 having parallel V-grooves for receiving connector pins and a pin-pressing upper plate 65 having projections (not shown) corresponding to the V-grooves and pressing the connector pins. The upper plate is arranged on the front end of a clamping plate 73, and the clamping plate 73 is connected to a cylinder 66 secured to the slider 39 through a bracket 141. The clamping plate 73 is attached to the top face of the slider 39 through swinging levers 67 and 68 pivoted on the slider 39. When the cylinder 66 is driven in the direction of an arrow C1, the swinging levers 67 and 68 are rotated in the direction of an arrow D to project the pin-pressing upper plate 65 forward and clamp the connector pins (not shown) in the V-grooves of the lower plate 64 by spring means not shown in the drawings (or by the elasticity of the upper plate per se). The clamper 140 clamps the gold-plated connecting portions 8a of the connector pins 8 (see FIG. 5) of the belt 2.

Figure 11:
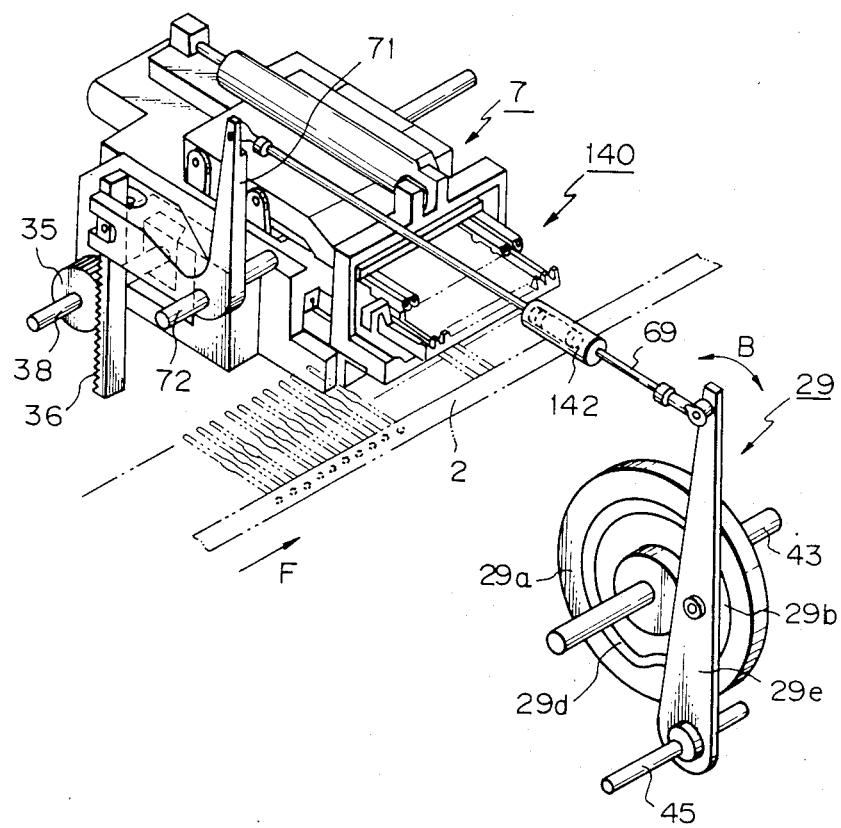
FIG. 11 is a diagram illustrating the structure of a mechanism for rotating the inserter head shown in FIG. 10.

FIG. 11 illustrates the rotation mechanism of the inserter head 7 shown in FIG. 10. The rotation shaft 38 to which the inserter head 7 is secured is arranged in parallel to the feed direction (arrow F) of the continuous belt 2. A pinion 35 is secured to the rotation shaft 38, and a rack 36 to be engaged with this pinion 35 is attached to the top end of one arm of a lever 71 comprising two arms. The lever 71 is pivoted on a shaft 72 secured to a body frame (not shown) of the inserter apparatus. A rod 69 of the second cam link mechanism 29 is connected to the top end of the other arm of the lever 71. The swinging lever 29e is oscillated as indicated by an arrow B by the rotation of the cam disc 29a and the lever 71 is rotated around the shaft 72 to move the rack 36 in the vertical direction, whereby the pinion 35 is rotated and the inserter 7 is rotated. A spring 142 is arranged at the intermediate portion of the rod 69 to remove the back-lash of the rack-pinion gear.

Figure 12:
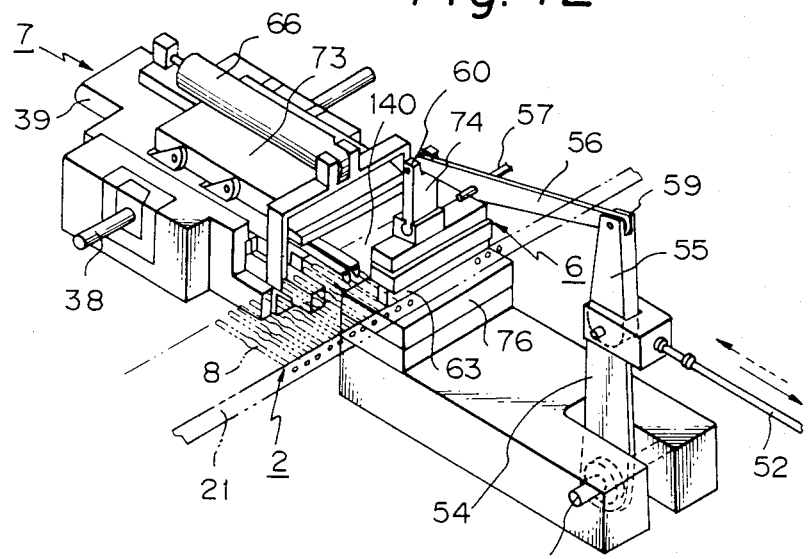
FIG. 12 is a diagram illustrating the structure of a mechanism for cutting the belt of connector pins.

FIG. 12 is a perspective view illustrating the appearance of the cutting means 6. The mechanism for driving the cutting means 6 is substantially the same as the mechanism shown in FIG. 9, though the two mechanisms differ in shape to some extent. When the connector pins 8 of the continuous belt 2 are clamped by the clamper 140 of the inserter head 7, the cutting means 6 is brought down and the connector pins 8 are cut and separated from the frame 21 by the cutter 63. Reference numeral 76 represents a cutting die for supporting the belt 2.

Figure 13:
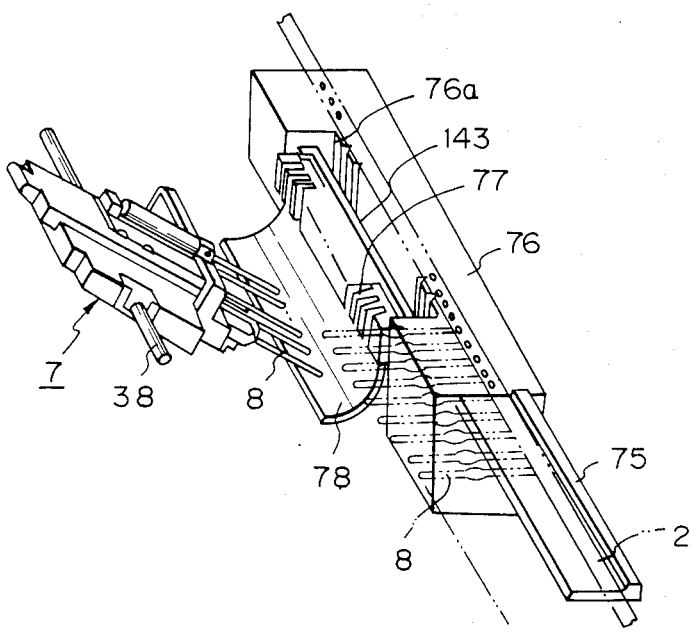
FIG. 13 is a perspective view showing a pin check means.
Figure 14:
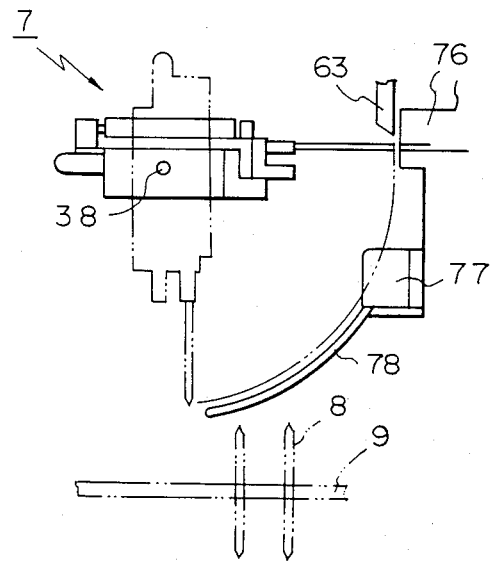
FIG. 14 is a side view of the pin check means shown in FIG. 13.
Figure 15:
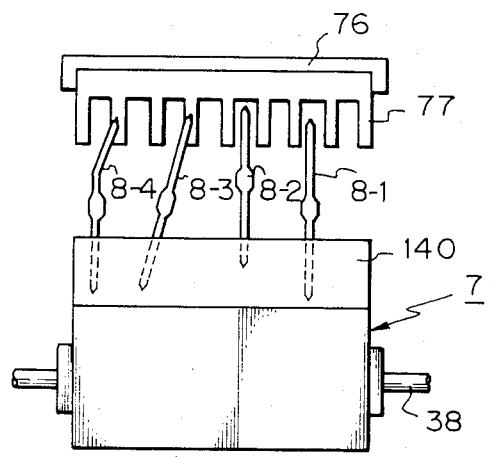
FIG. 15 is a diagram illustrating the state of clamping the connector pins.

After cutting and separation of the connector pins 8, the inserter head 7 is rotated by 90° by the above-mentioned rotation mechanism to direct downward the connector pins 8 held by the clamper 140. Means for checking the clamping state of the connector pins 8 is shown in FIG. 13. A comb member 77 composed of a conductive material such as stainless steel is arranged on the inner side of a cutting recess 76a of the die 76 through an insulating plate 143. The pitch of comb teeth of the comb member 77 is the same as the pitch of the connector pins 8 of the belt 2. A pin check plate 78 formed of a conductive material such as stainless steel is arranged below the comb member 77 along the locus of the top end of the connector pin 8 moved by the rotation of the inserter head 7. As shown in FIG. 14, the pin check plate 78 preferably covers an area from below the comb member 77 to a point just before the position at which the inserter head 7 is rotated by 90°. If the clamping state of the connector pin is normal, as indicated by reference numeral 8-1 in FIG. 15, the connector pin 8-1 does not come into contact with any part of the pin check plate 78. The connector pin 8-2 has come out of alignment because of insufficient clamping during the rotation after the cutting operation. This connector pin 8-2 comes into contact with the inner wall of the comb member 77 or the pin check plate 78. The connector pin 8-3 has been clamped at an oblique angle by the clamper 140, and reference numeral 8-4 represents a bent or broken connector pin. Each of the connector pins 8-3 and 8-4 comes into contact with the comb member 77. By detecting an electric current between the clamper 140 and the comb member 77 or pin check plate 78, the presence of a defective connector pin coming into contact with the comb member 77 or pin check plate 78 is detected. When a defective connector pin is detected, the pin-inserting operation is stopped.

Figure 16:
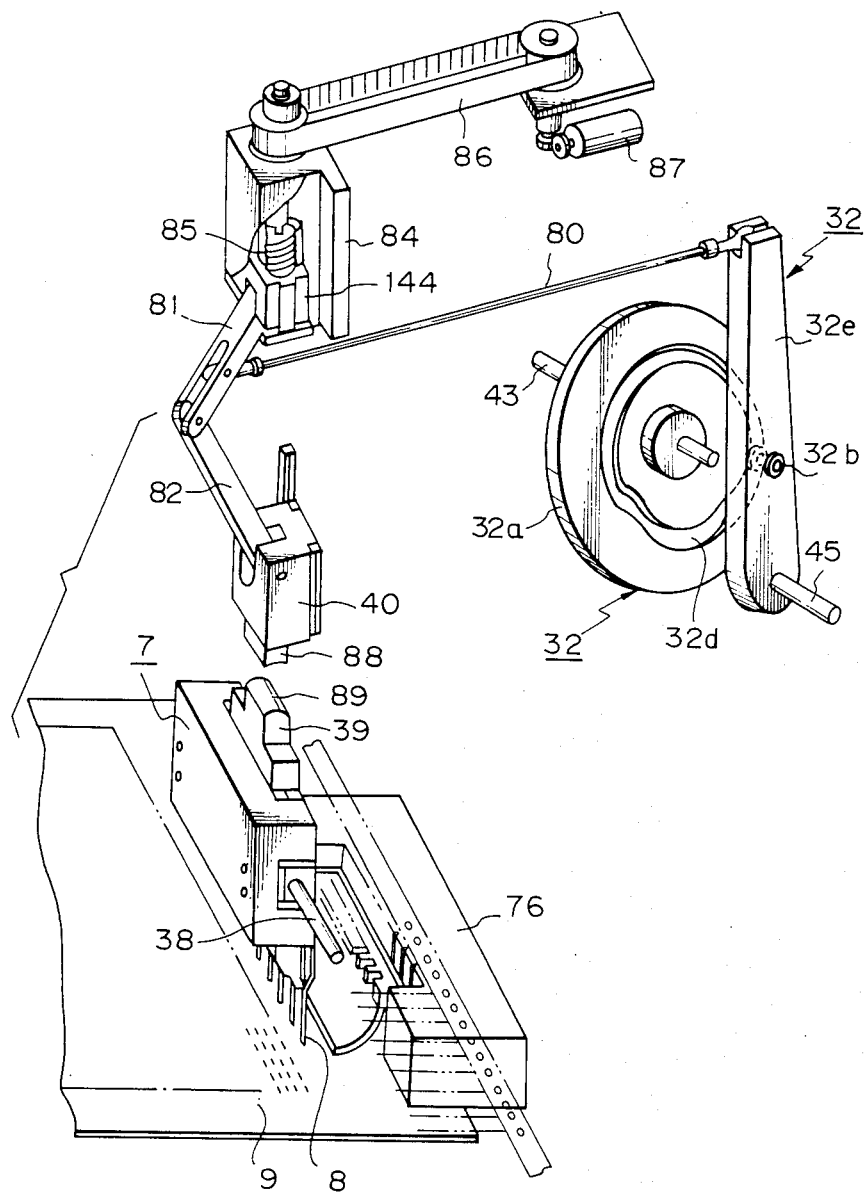
FIG. 16 is a diagram illustrating the structure of the mechanism for press-inserting connector pins.

FIG. 16 is a diagram illustrating in detail the pin-inserting driving mechanism of the inserter head 7. A rod 80 of the fifth cam link mechanism 32 is connected to a toggle mechanism comprising levers 81 and 82. The top end of the lever 81 is vertically slidable in a stroke adjusting block 144 within a housing 84 secured to a body frame (not shown) of the inserter apparatus. The vertical movement of the end of the lever 81 is regulated by a screw 85. The position of the lower end of the screw 85 onto which the lever 81 impinges can be adjusted by rotating and driving the screw 85 by a worm gear motor 87 through a belt 86. By the adjustment of the position of the screw 85, the vertical stroke of the pressing block 40 pivoted on the lower end of the lever 82 can be varied with respect to a constant cam stroke, and the insertion depth of the pin 8 can be adjusted according to the thickness of the printed circuit board 9. The pressing block 40 has a pressing member 88 on the lower end thereof. The pressing surface of the lower end of the pressing member 88 has a concave arcuate shape corresponding to the convex arcuate surface of the end 89 of the slider 39 of the inserter head 7. In order to absorb minute deviations in the thickness of the printed circuit board 9, the pressing member 88 is preferably secured to the pressing block 40 through an elastic member (not shown) formed of a urethane rubber or the like.

Figure 17A:
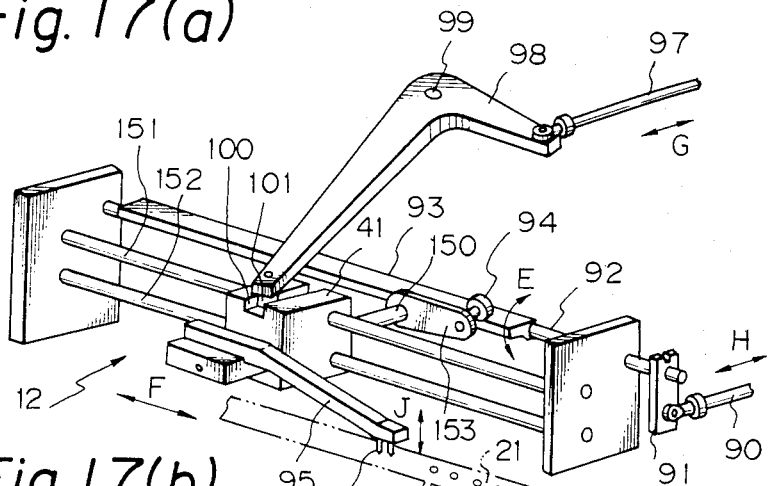
FIG. 17-(a) is a diagram illustrating the structure of the belt feed means, and FIG. 17-(b) is a diagram illustrating the movement of the belt feed means.
Figure 17B:
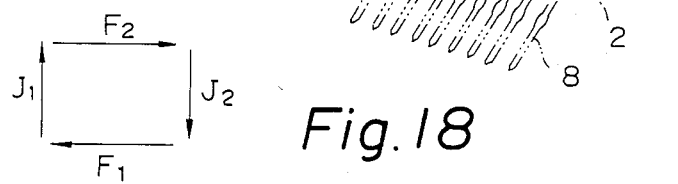

FIG. 17-(a) is a diagram illustrating in detail a feeding means 12 for the continuous belt 2. A slider block 41 is slidably mounted on two guide rods 151 and 152. A feed lever 95 secured to a rotation shaft 150 is attached to the front face of the slider block 41 so that the feed lever 95 can rotate relative to the slider block 41. A pin 96 to be engaged with the feed hole 22 of the belt frame 21 is arranged on the top end of the feed lever 95. A roller 94 is disposed on the end of the rotation shaft 150 through an arm 153. The arm 153 is always urged downward by a spring (not shown). The roller 94 rolls on a guide rail 93, and the guide rail 93 is secured to a shaft 92. A rod 90 connected to the cam disc of the sixth cam link mechanism 33 (see FIGS. 7 and 8) is connected to the end of the shaft 92 through a lever 91. A sliding piece 101 on the end of the lever 98 forming the seventh cam link mechanism 34 (see FIGS. 7 and 8) is anchored in a guide groove 100 on the top face of the slider block 41. A rod 97 connected to a cam disc not shown in the drawing is connected to the other end of the lever 98.

When the rod 90 is reciprocated as indicated by an arrow H by the sixth cam link mechanism 33, the rotation shaft 92 is rotated and the guide rail 93 secured to the rotation shaft 92 is oscillated as indicated by an arrow E, whereby the arm 153 is swung to oscillate the feed lever 95 through the rotation shaft 150 and move the pin 96 vertically as indicated by an arrow J.

When the rod 97 is reciprocated as indicated by an arrow G by the seventh cam link mechanism 34, the slider block 41 is reciprocated as indicated by an arrow F through the lever 98.

The cam groove shapes of the cam plates 33a and 34a of the sixth and seventh cam links 33 and 34 are appropriately adjusted, and the pin 96 of the feed lever 95 is moved rectangularly in the directions F1→J1→F2→J2 as shown in FIG. 17-(b), whereby the belt frame 21 is intermittently fed synchronously with the respective processing operations (such as the cutting, clamping, and inserting operations).

Figure 18:
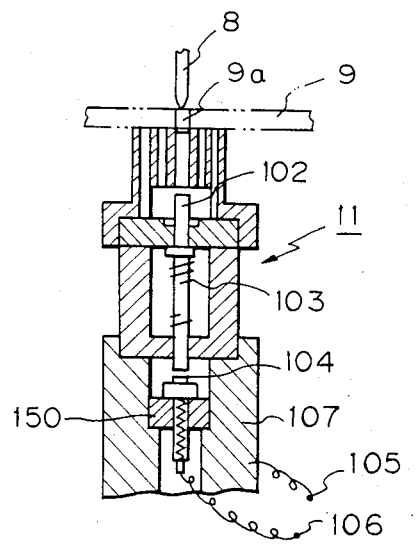
FIG. 18 is a sectional view of means for detecting the press insertion state of the connector pins.

An example of the detecting means for checking whether or not the connector pins 8 are properly inserted is illustrated in FIG. 18. A detecting pin 102 is arranged in the support means 11 for supporting the printed circuit board 9 from below at the time of the press insertion of the connector pins 8. The detecting pin 102 is urged upward by a spring 103. An electric contact 104 is formed below the detecting pin 102. When the connector pin 8 is correctly pressed into the through hole 9a of the printed circuit board 9, the end of the pin depresses the detecting pin 102 and brings it down against the spring 103 and into contact with the electric contact 104, whereby a terminal 106 connected to the contact 104 is electrically connected to a terminal 105 connected to a metal case 107 of the support means 11. The contact 104 and the terminal 106 are supported by an insulator 150 which is installed in the metal case 107. By detecting this electric connection between the terminals 105 and 106, it can be detected whether the connector pin is correctly press-inserted.

Figure 19:
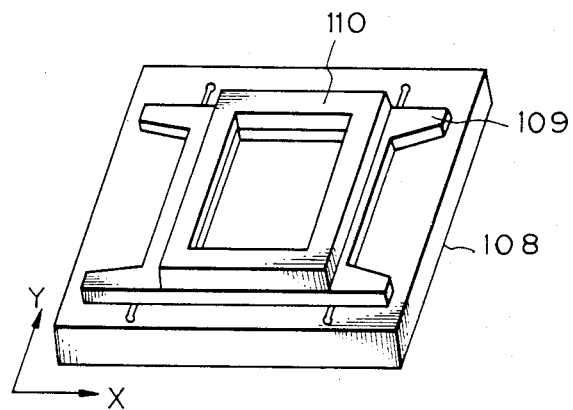
FIG. 19 is a perspective view showing an example of an X-Y table.

An example of the X-Y table having the printed circuit board loaded thereon is shown in FIG. 19. An X-table 109 and a Y-table 110 are placed on a base stand 108 so that they can be moved only in the X-direction and Y-direction, respectively. Each of the tables 109 and 110 is a rectangular frame, and the printed circuit board support means 11 (not shown) is arranged within the tables 109 and 110.

Figure 20:
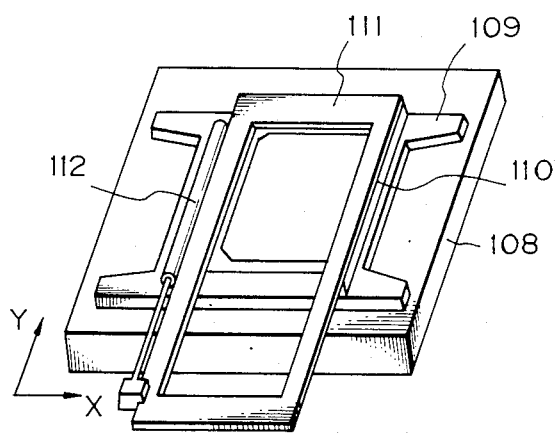
FIG. 20 is a perspective view showing another example of an X-Y table.

Another example of the X-Y table is shown in FIG. 20. In this example, an auxiliary Y-table 111 is arranged on the Y-table 110 so that the range of the movement in the Y-direction is expanded. Reference numeral 112 represents a cylinder for driving the auxiliary Y-table 111. Instead of the auxiliary Y-table 111, an auxiliary X-table may be disposed so that the range of the movement in the X-direction is expanded.

Figure 21:
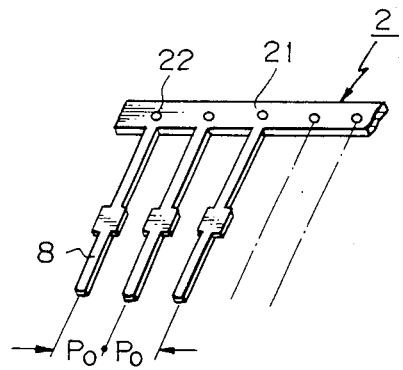
FIG. 21 is a diagram illustrating the pitch in the belt of connector pins.
Figure 22:
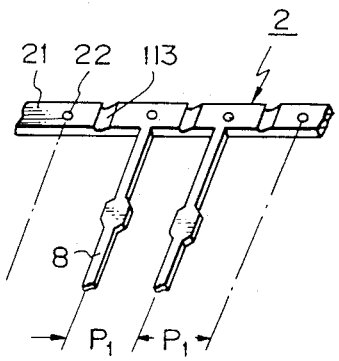
FIG. 22 is a perspective view showing the belt after expansion of the pitch shown in FIG. 21.
Figure 23:
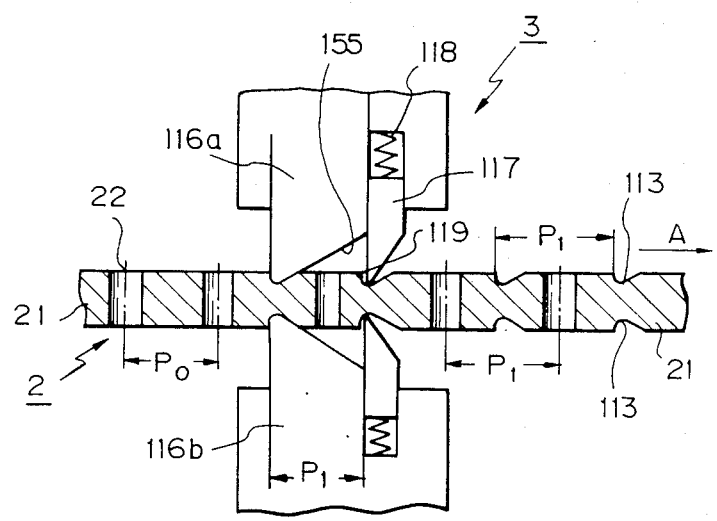
FIG. 23 is a diagram illustrating the structure of the pitch-expanding means; and, FIGS. 24A and 24B are a control block diagram of the connector pin inserter according to the present invention.

The structure of the pitch expanding means 3 (see FIG. 1) for expanding the pitch of the continuous belt 2 will now be described with reference to FIGS. 21 through 23. Ordinarily, there are two kinds of intervals for the through holes of printed circuit boards; that is, a millimeter unit interval of 2.50 mm and an inch unit interval of 0.1 inch (2.54 mm). Accordingly, two kinds of pitches should be formed for connector pins of continuous belts to be inserted into printed circuit boards. FIG. 21 shows a continuous belt 2 having a pitch P0 of 2.50 mm, and FIG. 22 shows a belt in which the pitch is expanded to P1 of 2.54 mm by forming a recess 113 between every two adjacent connector pins 8 by pressing. Pressing is accomplished, for example, by forming the recess 113 between every two adjacent holes 22 of the belt frame 21 by a pair of upper and lower pressing molds 116a and 116b having a pressing inclined face 155 as shown in FIG. 23. The thickness of the pressing mold is P1, and a stopper 117 to be projected toward the frame by a spring 118 is arranged on the side face of the pressing mold. By pressing the frame 21 from above and below by the pressing molds 116a and 116b, the frame 21 is pressed by the inclined faces 155 of the pressing molds and is elongated in the direction of an arrow A. By continuing this pressing until the stopper 117 impinges against the vertical step portion 119 of the adjacent recess 113, the recesses 113 can be formed at the pitch P1. At each pressing, the feed pitch of the frame 21 is P0. In this manner, the continuous belt having the pitch P0 can be changed to a belt having the pitch P1.

Figure 24B:
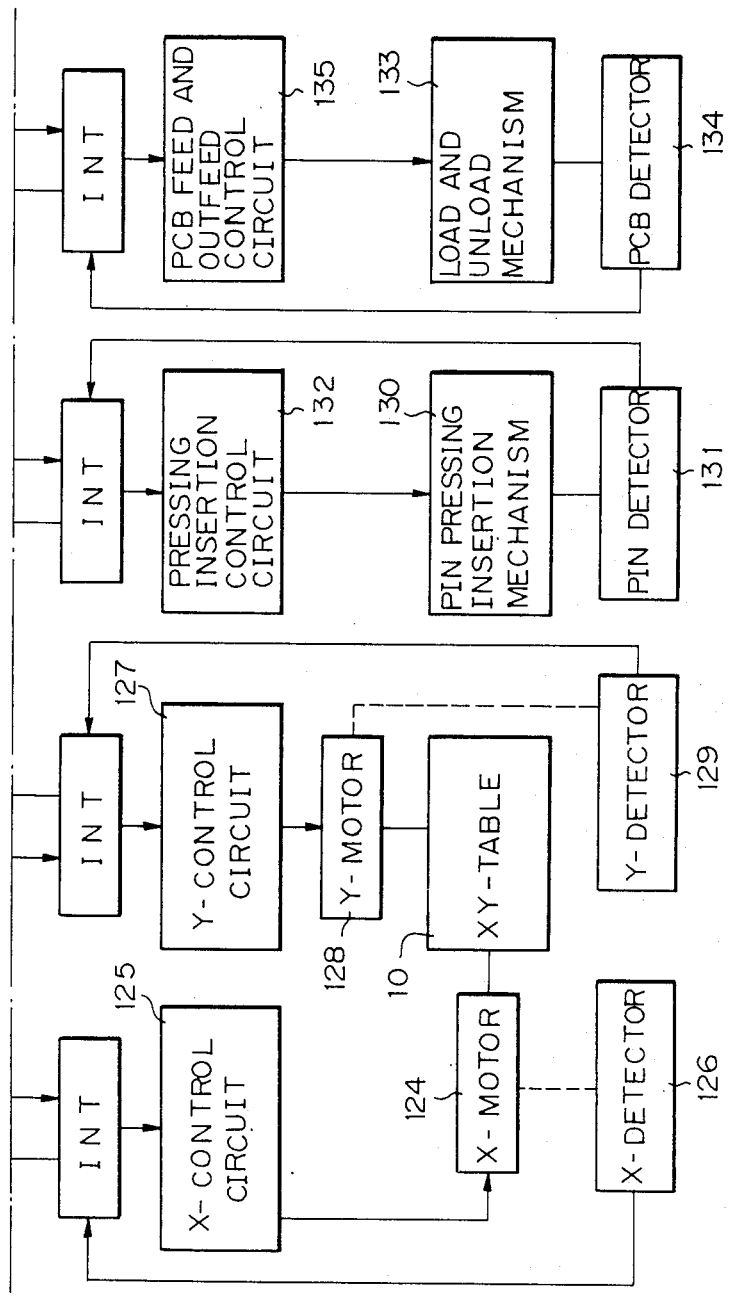

FIG. 24 is a block diagram of the control zone of the connector pin inserter according to the present invention. The X-Y table, the cam plates, and other parts of the inserter are sequentially controlled by a processor 123. The processor 123 is connected to a printer 120, a floppy 121, and a CRT display 122 through an interface circuit INT to read sequence program data, and to display and print the results of the processing. The processor 123 may be connected to a host computer 124 so that various production information and program data are input to the processor 123. The printed circuit board is loaded on the X-Y table 10 by a load and unload mechanism 133 consisting of a robot or the like. While the printed circuit board is delivered by the robot or the like, the kind of printed circuit board is detected by a board detector 134. For this detection, a hole is formed on the printed circuit board in advance, marking is effected by attachment of a metal plate or the like, and this mark is read by an optical detector, whereby the kind of printed circuit board is discriminated. The detection data of the kind of printed circuit board is input to the processor 123. Based on this data, from a data file in the floppy 121, data for the pin insertion depth according to the thickness of the printed circuit board, the number of pins, and the arrangement order is selected. Based on this selected data, the processor 123 drives an X-motor 124 and a Y-motor 128 through an X-control circuit 125 and a Y-control circuit 127 to automatically move and control the X-Y table 10. An X-detector 126 and a Y-detector 129, each comprising an encoder or the like, are connected to the X-motor and Y-motor, respectively, to detect the positions of the X-table and Y-table. The detection data is fed back to the X-control circuit 125 and Y-control circuit 127 to perform feedback control of the X-motor 124 and Y-motor 128.

A press insertion control circuit 132 for driving a cam disc driving motor, a press insertion stroke adjusting motor, and a cylinder driving circuit for performing a series of operations of press-inserting the pins by a pin press insertion mechanism 130 comprising cam means, is controlled according to the kind of printed circuit board detected by the processor 123. An error signal or termination signal from a pin detector 131 comprising the means (see FIGS. 13, 14, and 15) for checking the clamping state of the pins, which is arranged in the pin cutting zone, and/or the press insertion detecting means (FIG. 18) arranged within the printed circuit board support means 11, is input to the processor 123 to actuate an alarm not shown in the drawing and stop the pin press insertion operation.

In the connector pin inserter according to the present invention, since connector pins are integrally connected in the form of a continuous comb-shaped belt (carrier), a series of pin attaching operations such as pin feeding, clamping, and press insertion can be completely automated, and productivity can be increased.

Furthermore, if the kind of the printed circuit board is detected, and selection of the data file is automatically carried out, the operation of inserting pins into different kinds of printed circuit boards can be continuously performed automatically.

Moreover, by effecting the respective operations for press insertion of the pins by a series of cam means arranged on the same cam shaft, complete synchronism can be assured at the respective operations, and even if the driving speed is changed, this synchronism is not disturbed. Still further, since a toggle mechanism connected to the cam driving mechanism can be used, insertion of the pins can be performed under an elevated pressure and the reliability of the product can be improved.

By cutting and separating a continuous belt of connector pins after clamping, and by disposing means for checking erroneous clamping at a position just before press insertion after cutting, erroneous clamping can be easily detected and defective products can be removed.

Still further, if the top ends of respective teeth of the connector pins connected in the continuous comb-like form are plated with gold, the plating operation can be facilitated. By clamping the gold-plated top portions by a clamper, cutting the root portion of the respective teeth, and inserting pins from these root portions into a printed circuit board, the peeling of plated gold of the pin top can be prevented at the press insertion step.

We claim:

1. A connector pin inserter for feeding continuous connector pins formed integrally in a comb-like form as a belt-like carrier, separating the connector pins from the carrier and pressing the connector pins into through holes of a printed circuit board, said connector pin inserter comprising a board detector for detecting the kind of printed circuit board, means for reading detection results from the board detector, applying moving conditions to an X-Y table, disposed below a press-inserting mechanism for the connector pin to set the position of the printed circuit board, and further applying press-inserting conditions to a press-inserting mechanism for performing a series of operations of press-inserting pins, based on data of the board thickness, press-inserting position, pin size and insertion pitch selected according to the kind of printed circuit board detected, and a plurality of cam link mechanisms arranged on a same cam axis, wherein said connector pin inserter further comprises the following means driven by each cam link mechanism: (a) cutting means for separating a predetermined number of connector pins held by a clamping mechanism, (b) push-out means for pushing out the clamping mechanism holding the separated connector pins thereon from an inserter head and pressing the connector pins into through holes of the printed circuit board, (c) rotating means for rotating the inserter head around an axis parallel to the feed direction of the carrier, and (d) feed means for intermittently feeding the carrier, and wherein the series of operations for cutting and separating the continuous connector pins and inserting the separated connector pins into through holes of the printed circuit board are sequentially controlled.

2. A connector pin inserter as set forth in claim 1, wherein each connector pin comprises a connecting portion to be electrically coupled to a mating connector, an enlarged central portion and a terminal portion projecting from the back face of the printed circuit board.

3. A connector pin inserter as set forth in claim 2, wherein the connecting portion of the connector pin is a free end and the terminal portion is a root portion formed integrally with the carrier, and the connecting portion is plated with gold.

4. A connector pin inserter as set forth in claim 1, wherein the carrier is wound together with an interlayer sheet in the form of a feed roll for preventing entanglement of the connector pins.

5. A connector pin inserter as set forth in claim 1, wherein each cam link mechanism comprises a disc having a cam groove, which is attached to said same cam axis and a cam follower engaged with the cam groove, and further comprises a swinging lever mounted on a common axis.

6. A connector pin inserter as set forth in claim 1, which further comprises pin detecting means for detecting the connector pins of the carrier and vertically movable support means for supporting the printed circuit board below the pin insertion position of the printed circuit board.

7. A connector pin inserter as set forth in claim 5, wherein the feed means comprises a lever having a pin to be engaged in the feed hole of the carrier and said lever is moved along a rectangular locus by a cam link mechanism for driving in the horizontal direction and a cam link mechanism for driving in the vertical direction to intermittently feed the carrier.

8. A connector pin inserter as set forth in claim 1, wherein said clamping mechanism has a predetermined number of parallel V-grooves for receiving connector pins, and pressing and fixing means to press and fix the connector pins in said V-grooves.

9. A connector pin inserter as set forth in claim 1, wherein said rotating means is a rack pinion mechanism comprising a pinion secured to a shaft parallel to the feed direction of the carrier and a rack driven by said cam link mechanism.

10. A connector pin inserter as set forth in claim 1, wherein said inserter head is rotated from the horizontal position where the connector pins are held horizontally to the vertical position where the connector pins are held vertically downward.

11. A connector pin inserter as set forth in claim 10, wherein detecting means is disposed to detect the holding state of the connector pins held by the clamping mechanism during rotation of the inserter head.

12. A connector pin inserter as set forth in claim 11, wherein said detecting means comprises an electrically conductive comb member having grooves formed on the passage for rotary movement of the top ends of the connector pins at the same pitch as that of the connector pins and an electrically conductive pin check plate having an arcuate section coinciding with the arcuate locus of the top ends of the connector pins, which is arranged below the comb member contiguously thereto, and when a connector pin comes into contact with the comb member or pin check plate during rotation, the contact is electrically detected to detect insufficient holding of the connector pin.

13. A connector pin inserter as set forth in claim 1, wherein the cam link mechanism for driving said cutting means includes a toggle mechanism.

14. A connector pin inserter as set forth in claim 1, wherein the cam link mechanism for driving said push-out means includes a toggle mechanism.

15. A connector pin inserter as set forth in claim 6, wherein the printed circuit board supporting means comprises means for detecting inserted connector pins.

16. A connector pin inserter as set forth in claim 6, wherein said X-Y table comprises an X-table consisting of a rectangular frame and a Y-table consisting of a rectangular frame, and said printed circuit board support means is arranged within the X-Y table.

17. A connector pin inserter as set forth in claim 16, wherein a movement range expanding auxiliary table movable in the X- or Y-direction is disposed on the X-Y table.

18. A connector pin inserter as set forth in claim 1, which further comprises means for expanding the pitch of the carrier.

19. A connector pin inserter as set forth in claim 18, wherein said pitch expanding means is a press device having press molds for pressing the carrier from above and below, and the pressing faces of the press molds are inclined and shaped so that the pressed carrier is elongated in a certain direction.

20. A connector pin inserter as set forth in claim 19, wherein detecting means is disposed to detect that the carrier pressed by the press device is elongated by a predetermined length, and said detecting means is connected to the press device so that when the carrier is elongated by the predetermined length, the pressing operation of the press device is stopped.

* * * * *

UNITED STATES PATENT AND TRADEMARK OFFICE
CERTIFICATE OF CORRECTION

PATENT NO. : 4,672,735
DATED : June 16, 1987
INVENTOR(S) : Tamano et al.

It is certified that error appears in the above-identified patent and that said Letters Patent is hereby corrected as shown below:

Title page

[56] References Cited:

line 3, "Gitaraibeh" should be --Gharaibeh--;

line 4, "Olney, Jr." should be --Olney, Jr. et al.--;

line 7, "Misawa" should be --Misawa et al.--;

line 8, "Brown" should be --Brown et al.--.

Col. 1, line 65, "insention" should be --insertion--.

Col. 3, line 1, delete "a";

line 1, "diagram" should be diagrams.

Signed and Sealed this

Tenth Day of May, 1988

Attest:

DONALD J. QUIGG

Attesting Officer

Commissioner of Patents and Trademarks